(12) United States Patent
Wakimoto

(10) Patent No.: US 9,385,210 B2
(45) Date of Patent: Jul. 5, 2016

(54) METHOD FOR MANUFACTURING SEMICONDUCTOR DEVICE USING A GETTERING LAYER

(71) Applicant: FUJI ELECTRIC CO., LTD., Kawasaki-shi (JP)

(72) Inventor: Hiroki Wakimoto, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/537,279

(22) Filed: Nov. 10, 2014

(65) Prior Publication Data

US 2015/0064852 A1 Mar. 5, 2015

Related U.S. Application Data

(63) Continuation of application No. PCT/JP2013/068798, filed on Jul. 9, 2013.

(30) Foreign Application Priority Data

Aug. 22, 2012 (JP) .................................. 2012-183093

(51) Int. Cl.
*H01L 29/66* (2006.01)
*H01L 21/322* (2006.01)
*H01L 29/78* (2006.01)
*H01L 29/40* (2006.01)
*H01L 29/739* (2006.01)
*H01L 29/06* (2006.01)
*H01L 21/02* (2006.01)

(52) U.S. Cl.
CPC ...... *H01L 29/66333* (2013.01); *H01L 21/0262* (2013.01); *H01L 21/02532* (2013.01); *H01L 21/02595* (2013.01); *H01L 21/3221* (2013.01); *H01L 29/0619* (2013.01); *H01L 29/404* (2013.01); *H01L 29/7395* (2013.01); *H01L 29/78* (2013.01)

(58) Field of Classification Search
CPC ...................... H01L 29/66333; H01L 29/0619
See application file for complete search history.

(56) References Cited

U.S. PATENT DOCUMENTS 5,162,241 A 11/1992 Mori et al.
5,534,294 A 7/1996 Kubota et al.
(Continued)

FOREIGN PATENT DOCUMENTS

EP 0973190 A2 1/2000
JP S58-138035 A 8/1983
(Continued)

*Primary Examiner* — Mamadou Diallo
(74) *Attorney, Agent, or Firm* — Rabin & Berdo, P.C.

(57) ABSTRACT

In a method for manufacturing a reverse blocking MOS semiconductor device, a gettering polysilicon layer is formed on a rear surface of an FZ silicon substrate. Then, a $p^+$ isolation layer for obtaining a reverse voltage blocking capability is formed. A front surface structure including a MOS gate structure is formed on a front surface of the FZ silicon substrate. The rear surface of the FZ silicon substrate is ground to reduce the thickness of the FZ silicon substrate. The gettering polysilicon layer is formed with such a thickness that it remains, without being vanished by single crystallization, until a process for forming the front surface structure including the MOS gate structure ends. Therefore, it is possible to sufficiently maintain the gettering function of the gettering polysilicon layer even in a heat treatment process subsequent to an isolation diffusion process.

11 Claims, 17 Drawing Sheets

(56) References Cited

U.S. PATENT DOCUMENTS

| | | | |
|---|---|---|---|
| 6,194,290 B1* | 2/2001 | Kub et al. | 438/455 |
| 6,229,196 B1* | 5/2001 | Shishido et al. | 257/617 |
| 2012/0149170 A1* | 6/2012 | Nakazawa | 438/424 |

FOREIGN PATENT DOCUMENTS

| JP | H07-86289 A | 3/1995 |
|---|---|---|
| JP | 2575545 B2 | 1/1997 |
| JP | H09-64051 A | 3/1997 |
| JP | 2000-021887 A | 1/2000 |
| JP | 2000-031153 A | 1/2000 |
| JP | 2002-299242 A | 10/2002 |
| JP | 2005-183628 A | 7/2005 |
| JP | 2006-140309 A | 6/2006 |
| JP | 2006-147739 A | 6/2006 |
| JP | 2006-294716 A | 10/2006 |
| JP | 2006-294772 A | 10/2006 |
| JP | 2006-319079 A | 11/2006 |
| JP | 2006-324431 A | 11/2006 |
| JP | 2010-232539 A | 10/2010 |

* cited by examiner

METHOD FOR MANUFACTURING SEMICONDUCTOR DEVICE USING A GETTERING LAYER

This application is a continuation under 35 U.S.C. 120 of International Application PCT/JP2013/068798 having the International Filing Date of Jul. 9, 2013, and having the benefit of the earlier filing date of Japanese Application No. 2012-183093, filed Aug. 22, 2012. All of the identified applications are fully incorporated herein by reference.

TECHNICAL FIELD

The present invention relates to a method for manufacturing a semiconductor device.

BACKGROUND ART

An insulated gate bipolar transistor (IGBT), which is one of power semiconductor elements, is a power element that has the high-speed switching characteristics and voltage-driven characteristics of a metal oxide semiconductor field effect transistor (MOSFET) and the low on-voltage characteristics of a bipolar transistor. The application range of the IGBT extends from the industrial field including, for example, a general-purpose inverter, an AC servomechanism, an uninterrupted power supply (UPS), or a switching power supply to the consumer equipment field including a microwave oven, a rice cooker, or a strobe. In recent years, research has been conducted on a technique which provides a bidirectional switching element in a matrix converter, such as a direct-link-type conversion circuit, in order to perform alternating current (AC)/AC conversion, thereby reducing the size, weight, and costs of a circuit and increasing the efficiency and high-speed response of the circuit.

The bidirectional switching element can be simply configured by connecting reverse blocking IGBTs (RB-IGBTs) with a reverse voltage blocking capability that has the same high reliability as a forward voltage blocking capability in inverse parallel, which is preferable. However, the IGBT according to the related art has a high-reliability forward voltage blocking capability, but is generally designed and manufactured such that the reverse voltage blocking capability of the IGBT does not need to have the same level of reliability as the forward voltage blocking capability. Therefore, it is necessary to develop an IGBT (hereinafter, referred to as a reverse blocking IGBT) which is required to form the above-mentioned bidirectional switching element and has a reverse voltage blocking capability with the same level of reliability as the forward voltage blocking capability. The structure of the reverse blocking IGBT according to the related art will be described below. FIG. 2 is a cross-sectional view illustrating a main portion of a general reverse blocking IGBT according to the related art.

FIG. 2 is a cross-sectional view illustrating a main portion of the device structure of the reverse blocking IGBT. The layer structure of the reverse blocking IGBT illustrated in FIG. 2 differs from the layer structure of a general IGBT in that the reverse blocking IGBT includes a p-type isolation layer 2 which connects two opposite main surfaces with a diffusion layer of a conductivity type different from that of an $n^-$ substrate 1 in order to make the high-reliability reverse voltage blocking capability work effectively. The termination of a flat pn junction (hereinafter, referred to as a collector junction 8a) which is formed between an $n^-$ drift layer ($n^-$ substrate 1) and a p-type collector layer 8 provided on the rear surface side of the substrate and bears the reverse breakdown voltage is bent toward the front surface of the substrate and is extended to the surface of the edge termination structure portion 30 close to the front surface of the substrate by the p-type isolation layer 2 which surrounds the outer circumference of an active portion 20 and the edge termination structure portion 30. In this way, the pn junction can serve as a collector junction 8a which intersects the front surface of the substrate. In the surface of the edge termination structure portion 30 close to the front surface of the substrate, it is possible to effectively ensure both a high-reliability forward breakdown voltage and a high-reliability reverse breakdown voltage, using a junction termination surface protection mechanism using a field oxide film 14 and an electric field reduction mechanism including a field limiting ring 15 and a field plate 16. In FIG. 2, reference numeral 3a denotes a p-type base layer, reference numeral 4 denotes an n-type emitter layer, reference numeral 5 denotes a gate oxide film, reference numeral 6 denotes a gate electrode, reference numeral 7 denotes an emitter electrode, and reference numeral 8-1 denotes a collector electrode.

A general IGBT which is not a reverse blocking type is used in a circuit under a DC power supply and does not require a reverse voltage blocking capability. Therefore, the general IGBT does not require the p-type isolation layer and the wafer process is simplified. The general IGBT has an advantage in terms of costs. In addition, the termination of the collector junction which bears the reverse breakdown voltage of the general IGBT is generally exposed from the cut surface of the chip. Therefore, it may be said that the general IGBT has the structure in which the reliability of the reverse voltage blocking capability is low and is manufactured by a manufacturing method in which the reliability of the reverse voltage blocking capability is low from the beginning.

Next, the outline of a method for manufacturing the above-described reverse blocking IGBT according to the related art illustrated in FIG. 2 will be described with reference to FIGS. 3 to 8. FIGS. 3 to 8 are cross-sectional views illustrating an element of the general reverse blocking IGBT according to the related art which is being manufactured. The cross-sectional views which are referred to in the following description illustrate the schematic cross-section of a portion of a silicon substrate (hereinafter, simply referred to as a substrate in some cases) corresponding to an element (cell) of the IGBT and the end of a chip. In FIGS. 3 to 8, a plurality of cells in an active portion and an edge termination structure portion are not illustrated. First, a gettering polysilicon layer 1b with a thickness of 1.5 μm or less is deposited on the rear surface of an n-type silicon substrate 1a by a chemical vapor deposition (CVD) method and an opening portion 12 is formed in an initial oxide film 11 formed on a front surface 9 of the substrate (FIG. 3). A boron deposition region 13 is formed through the opening portion 12 by, for example, a coating diffusion method or an ion implantation method (FIG. 4). When the breakdown voltage is 1200 V, boron (B) drive diffusion is performed in an oxygen atmosphere at a high temperature of 1300° C. for a long time to change the boron deposition region 13 to the p-type isolation layer 2 with a depth of 200 μm (FIG. 5).

Then, the initial oxide film 11 is removed and a polysilicon gate electrode 6 is formed on the front surface of the substrate, with a gate oxide film 5 interposed therebetween. Then, a p base layer 3a is formed by boron ion implantation and necessary drive thermal diffusion, using the gate oxide film 5 and the polysilicon gate electrode 6 formed on the front surface of the substrate as a mask. Crystal defects which are caused by high-concentration oxygen introduced during the isolation diffusion are gettered to the gettering polysilicon layer 1b provided on the rear surface of the substrate by a heat treatment process in this stage and the density of the crystal defects in an operation region of the IGBT is reduced. Then, an n+ emitter layer 4 and a p+ collector layer 3b are formed in the p base layer 3a. Then, an emitter electrode 7 is formed on the polysilicon gate electrode 6, with an interlayer insulating film interposed therebetween, and a necessary pattern is formed on the surfaces of the n+ emitter layer 4 and the p+ collector layer 3b so as to come into ohmic contact therewith (FIG. 6).

Then, the rear surface of the n-type silicon substrate 1a is ground such that the n-type silicon substrate 1a has a wafer thickness (200 μm) corresponding to the breakdown voltage. In addition, mechanical polishing or chemical etching is performed on the rear surface of the n-type silicon substrate 1a such that the p-type isolation layer 2 is exposed from the ground rear surface 10 (FIG. 7). In this stage, the entire layer including a large number of crystal defects gettered to the rear surface of the substrate is removed by rear surface grinding. Reference numeral 1 denotes the n-type silicon substrate after the rear surface is ground.

Then, a p+ collector layer 8 is formed on the rear surface 10 of the n-type silicon substrate 1. The p+ collector layer 8 is electrically connected to the p-type isolation layer 2. A collector electrode 8-1 is formed so as to come into contact with the p+ collector layer 8 and the n-type silicon substrate 1 is diced at the center 2-1 of the p-type isolation layer 2 (FIG. 8). In this way, the reverse blocking IGBT according to the related art is manufactured.

As the method for manufacturing the semiconductor device using gettering, a method has been proposed in which a step of forming, as a gettering layer, a layer including crystal defects, which are formed by ion implantation of a rare gas element, on the rear surface of a substrate is performed before a semiconductor functional region forming process including a thermal treatment that is performed at a temperature of 1000° C. or higher, thereby reducing the influence of the crystal defects, which are caused by high-concentration oxygen introduced into the silicon substrate due to high-temperature long-term isolation diffusion, on breakdown voltage characteristics (for example, see the following Patent Document 1).

In addition, as another method for manufacturing the semiconductor device using gettering, the following method has been proposed: a p-type isolation layer is selectively formed in the upper surface of an n-type silicon substrate by diffusion; a p-type impurity diffusion layer is formed on the entire bottom of the n-type silicon substrate by diffusion at the same time as the p-type isolation layer is formed; and a portion of the silicon substrate surrounded by the p-type isolation layer is an element forming region. Therefore, it is possible to hold a bidirectional breakdown voltage and the p-type impurity diffusion layer can function as a crystal defect gettering layer. As a result, the manufacturing method can form a semiconductor device with high reliability, such as an IGBT (for example, see the following Patent Document 2).

Furthermore, as the method for manufacturing the semiconductor device using gettering, a method has been proposed which forms a gettering polysilicon layer with a thickness (film thickness) of 0.5 μm to 1.5 μm on the rear surface of a wafer in order to reliably remove a crystal defect, without reducing gettering capability, even when a high-temperature heat treatment, such as hydrogen annealing, is performed in a reducing atmosphere (for example, see the following Patent Document 3).

In addition, a gettering method using a polysilicon back seal according to the related art has been proposed in which a gettering function is not sufficient and it is difficult to prevent the breakdown of a gate oxide film of a MOS transistor (for example, see the following Patent Document 4).

CITATION LIST

Patent Document

Patent Document 1: JP 2006-140309 A (Abstract)
Patent Document 2: JP 2006-147739 A (paragraph 0004)
Patent Document 3: JP 2000-31153 A (paragraphs 0006 and 0017)
Patent Document 4: JP 2000-21887 A (paragraph 0006)

As described above, in the method for manufacturing the reverse blocking IGBT according to the related art, before the wafer process (before the process for forming the MOS gate structure and the p-type isolation layer), the gettering polysilicon layer is formed with a thickness of 1.5 μm or less as a gettering site on one surface (hereinafter, referred to as the rear surface) of the silicon substrate. Then, the process for forming the p-type isolation layer required for the reverse blocking IGBT is performed on the front surface of the silicon substrate opposite to the rear surface. The gettering polysilicon layer getters heavy metal impurities which are introduced by a high-temperature long-term diffusion process associated with the p-type isolation layer forming process, or crystal defects which are caused by doping with oxygen. The heavy metal impurities or the crystal defects are fixed into the gettering polysilicon layer. In this way, the gettering polysilicon layer reduces heavy metal concentration and crystal defect density in the silicon substrate. In addition, when the function of gettering the heavy metal impurities or the crystal defects is valid even during the heat treatment for forming the MOS gate (metal-oxide-semiconductor insulated gate) structure, it is expected to suppress the occurrence of defects, such as abnormal gate characteristics or abnormal leakage current.

However, in practice, even when the gettering polysilicon layer is formed as the gettering layer, in some cases, yield is reduced. The effect of the gettering function is insufficient to suppress the occurrence of the defects, such as abnormal gate characteristics or abnormal leakage current. Therefore, in the related art, the following methods have been examined: a method which forms an additional gettering layer during a wafer process to suppress a reduction in yield; a method which forms the gettering layer using a sandblast method; and other gettering methods. However, it is difficult for these methods to sufficiently prevent a reduction in yield.

The invention has been made in order to solve the above-mentioned problems of the related art and an object of the invention is to provide a method for manufacturing a semiconductor device which can maintain the gettering function of a polysilicon layer which is formed in order to remove a crystal defect caused by a high-temperature long-term isolation diffusion process even in a heat treatment process subsequent to the isolation diffusion process.

SUMMARY

In order to solve the above-mentioned problems and achieve the object, according to an aspect of the invention, there is provided a method for manufacturing a reverse blocking semiconductor device that includes a second-conductivity-type isolation layer which is formed in a first-conductivity-type semiconductor substrate having a first main surface and a second main surface that are opposite to each other at a depth extending from the first main surface to the second main surface and has a forward voltage blocking capability and a reverse voltage blocking capability. The method has the following characteristics. First, a first step of forming a gettering polysilicon layer on the second main surface of the first-conductivity-type semiconductor substrate is performed. Then, a second step of forming the second-conductivity-type isolation layer in an outer circumferential portion which surrounds an active portion provided in a central portion of the first main surface at a depth extending from the first main surface to the second main surface is performed. Then, a third step of forming a front surface semiconductor region including an insulated gate structure on the first main surface of the first-conductivity-type semiconductor substrate in the active portion is performed. Then, a fourth step of grinding the second main surface of the first-conductivity-type semiconductor substrate to reduce the thickness of the first-conductivity-type semiconductor substrate to a value which is determined by a predetermined breakdown voltage. The first step forms the gettering polysilicon layer with such a thickness that the gettering polysilicon layer remains, without being vanished by single crystallization, until the third step ends.

In the method for manufacturing a semiconductor device according to the above-mentioned aspect of the invention, the thickness of the gettering polysilicon layer may be equal to or greater than 2 μm.

In the method for manufacturing a semiconductor device according to the above-mentioned aspect of the invention, the first step may include: a mounting step of mounting the first-conductivity-type semiconductor substrate on a boat of a chemical vapor deposition apparatus; a film deposition step of forming the gettering polysilicon layer with a thickness of 1.5 μm or less on the second main surface of the first-conductivity-type semiconductor substrate using a chemical vapor deposition method after the mounting step; and a detachment step of detaching the first-conductivity-type semiconductor substrate from the boat after the film deposition step. A set of the mounting step, the film deposition step, and the mounting step may be repeatedly performed to laminate the gettering polysilicon layer such that the gettering polysilicon layer has a necessary thickness.

In the method for manufacturing a semiconductor device according to the above-mentioned aspect of the invention, in the third step, both the front surface semiconductor region in the active portion and a front surface semiconductor region which forms a edge termination structure portion between the active portion and the second-conductivity-type isolation layer may be formed on the first main surface of the first-conductivity-type semiconductor substrate.

According to the method of manufacturing the semiconductor device of the invention, it is possible to maintain the gettering function of a polysilicon layer which is formed in order to remove a crystal defect caused by a high-temperature long-term isolation diffusion process even in a heat treatment process subsequent to the isolation diffusion process.

DETAILED DESCRIPTION

Figure 1:
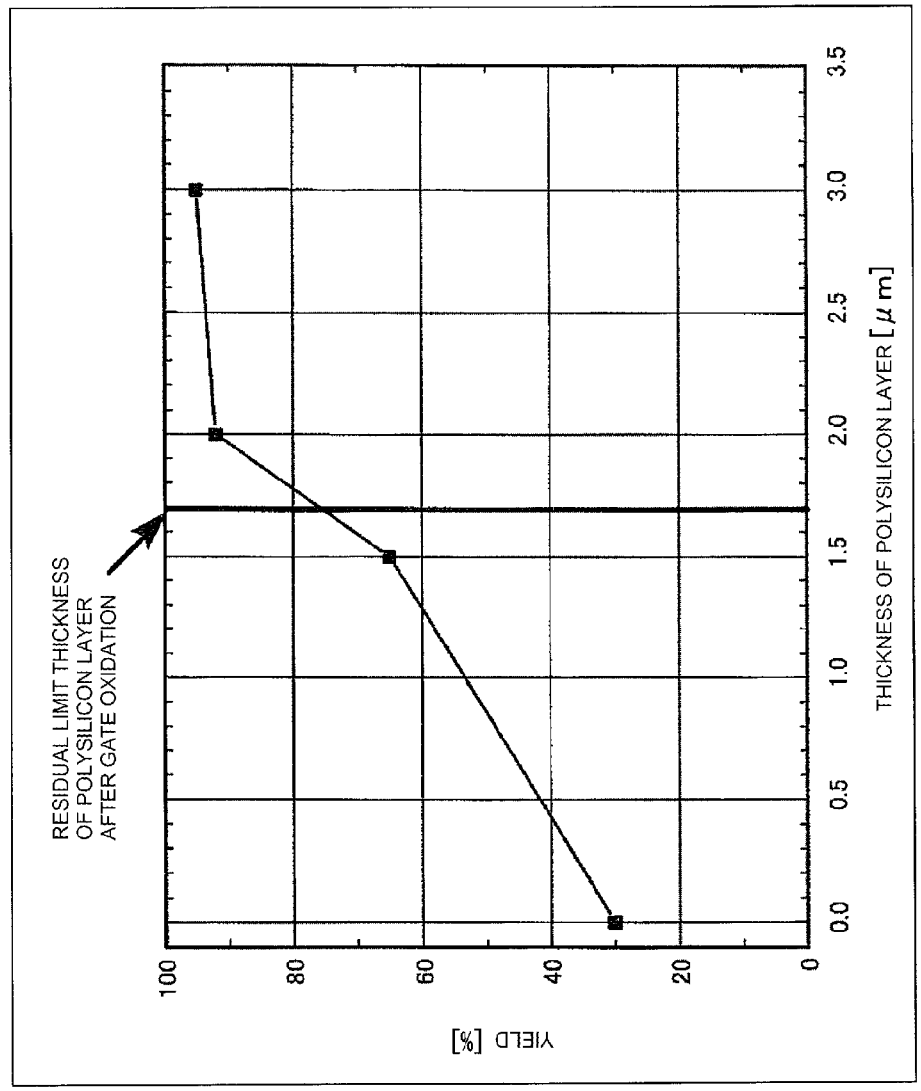
FIG. 1 is a characteristic diagram illustrating the relation between the original thickness of a formed gettering polysilicon layer and the yield of a reverse blocking IGBT according to the invention.
Figure 2:
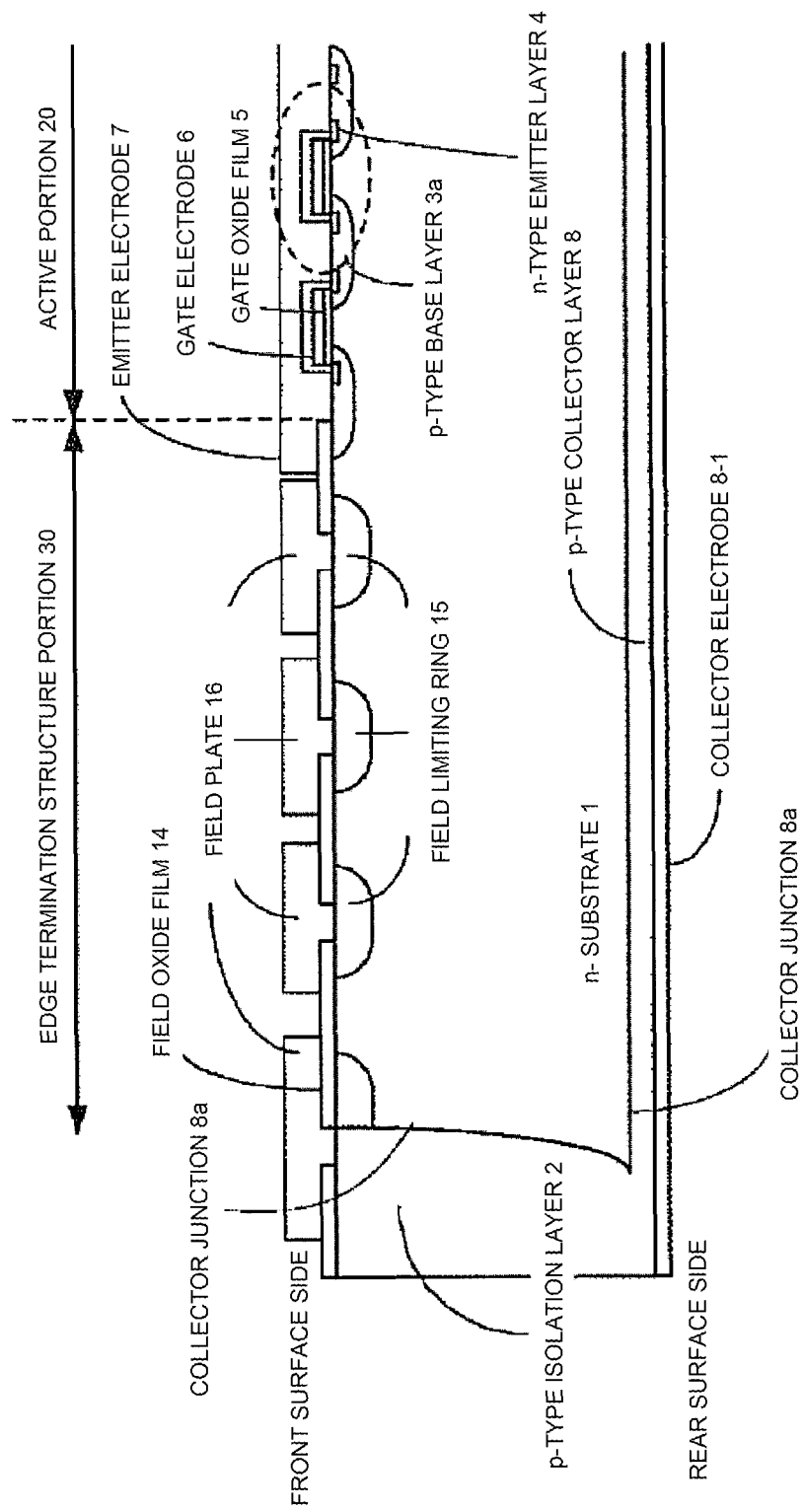
FIG. 2 is a cross-sectional view illustrating a main portion of a general reverse blocking IGBT according to the related art.
Figure 3:
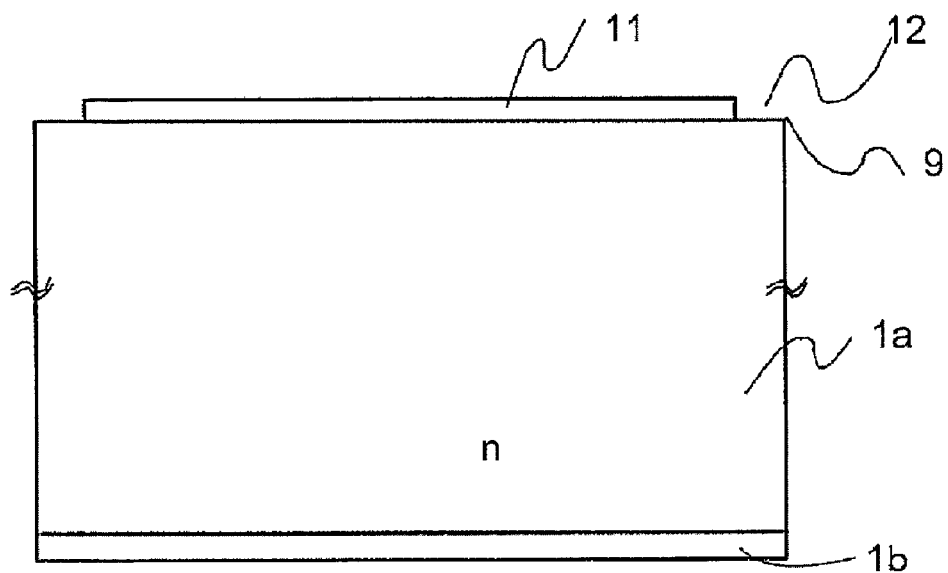
FIG. 3 is a cross-sectional view illustrating an element of the general reverse blocking IGBT according to the related art which is being manufactured (part 1)
Figure 4:
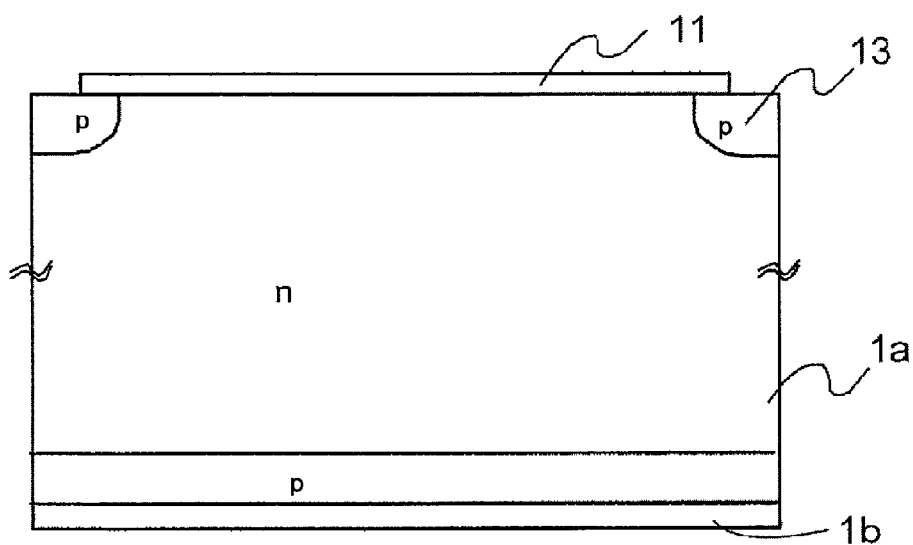
FIG. 4 is a cross-sectional view illustrating the element of the general reverse blocking IGBT according to the related art which is being manufactured (part 2)
Figure 5:
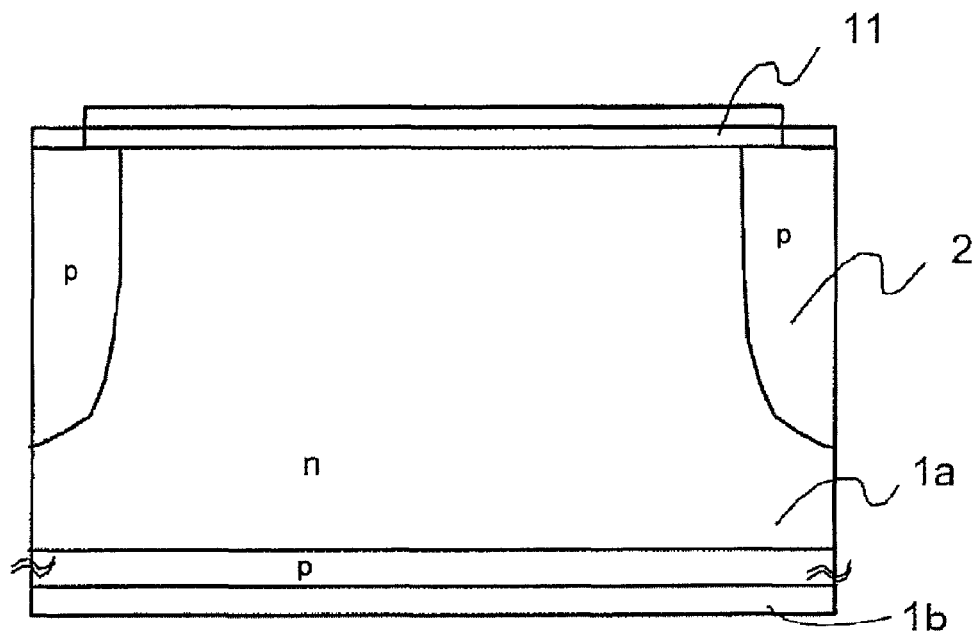
FIG. 5 is a cross-sectional view illustrating the element of the general reverse blocking IGBT according to the related art which is being manufactured (part 3)
Figure 6:
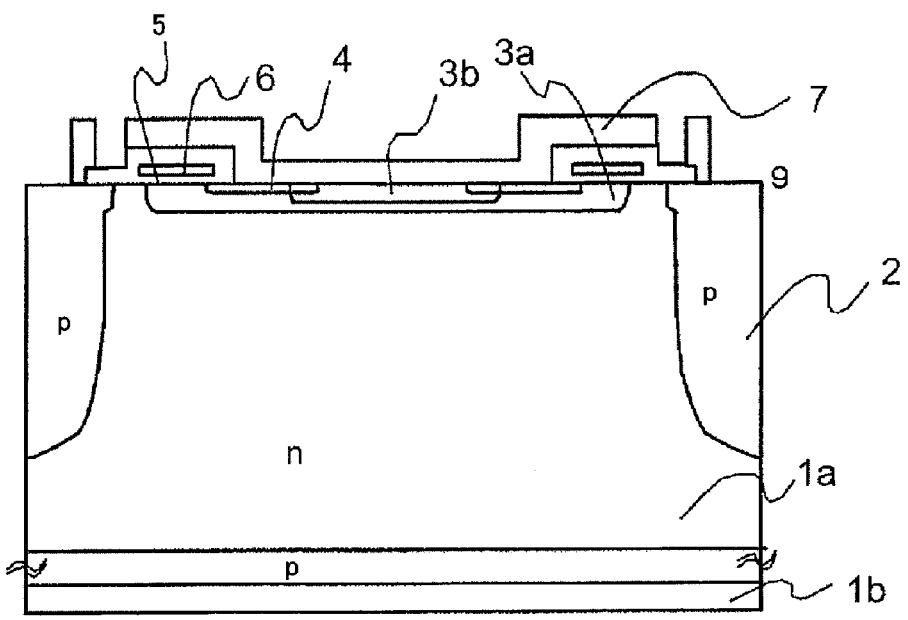
FIG. 6 is a cross-sectional view illustrating the element of the general reverse blocking IGBT according to the related art which is being manufactured (part 4)
Figure 7:
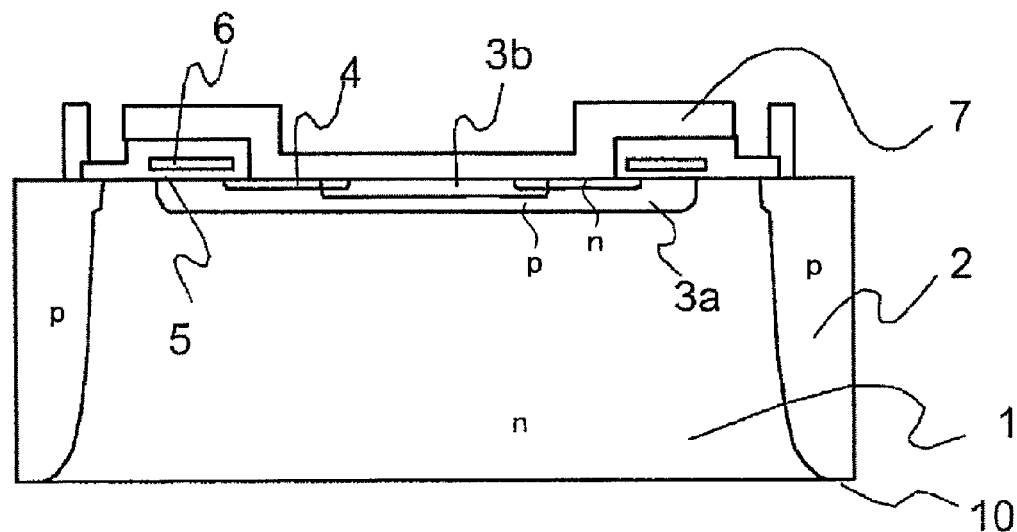
FIG. 7 is a cross-sectional view illustrating the element of the general reverse blocking IGBT according to the related art which is being manufactured (part 5)
Figure 8:
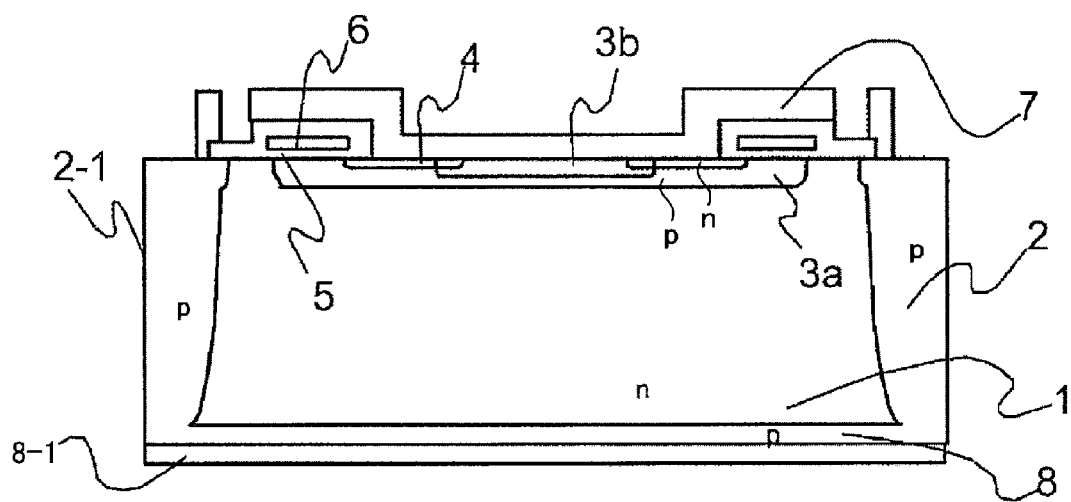
FIG. 8 is a cross-sectional view illustrating the element of the general reverse blocking IGBT according to the related art which is being manufactured (part 6)
Figure 9:
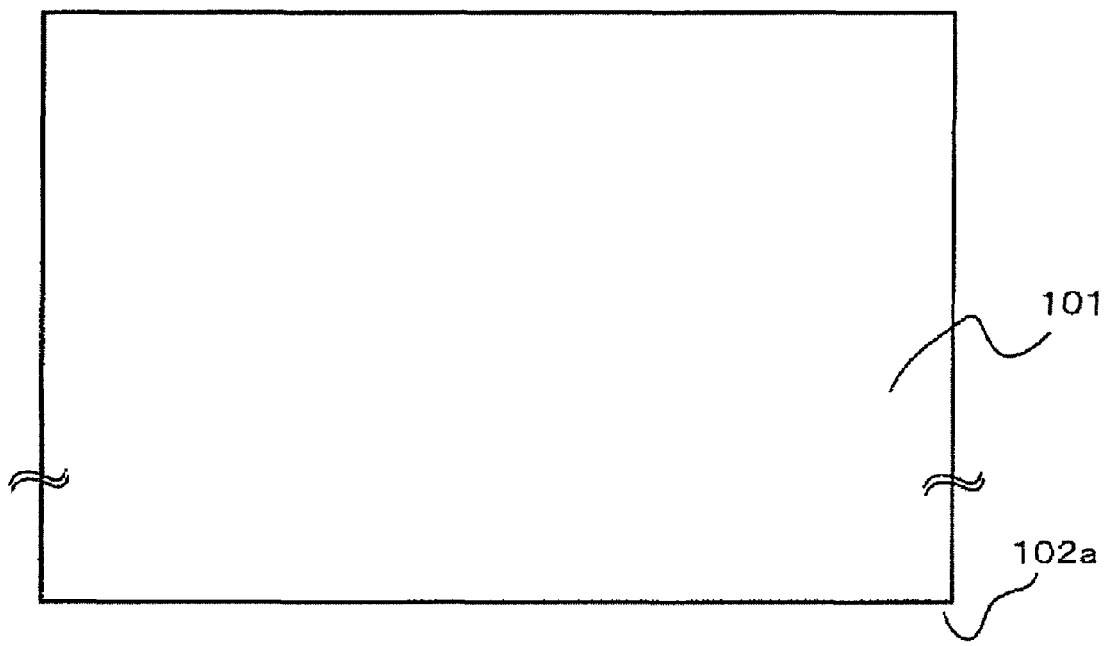
FIG. 9 is a cross-sectional view illustrating an element of a reverse blocking IGBT according to the invention which is being manufactured (part 1)

Hereinafter, a method for manufacturing a reverse blocking IGBT will be described in detail as an example of a method for manufacturing a semiconductor device according to a preferred embodiment of the invention with reference to the accompanying drawings. In the specification and the accompanying drawings, in the layers or regions having "n" or "p" appended thereto, an electron or a hole means a majority carrier. In addition, symbols "+" and "−" added to n or p mean that impurity concentration is higher and lower than that of the layer without the symbols. In the description of the following embodiments and the accompanying drawings, the same components are denoted by the same reference numerals and the description thereof will not be repeated. In addition, in the following description, a first main surface is a front surface and a second main surface is a rear surface. In some cases, a semiconductor substrate is simply written as a substrate. In the following description, a first conductivity type is an n type and a second conductivity type is a p type. In the accompanying drawings described in the embodiment, for ease of viewing or understanding, a scale and a dimensional ratio are different from the actual scale and dimensional ratio. The invention is not limited to the following embodiment as long as it does not depart from the scope and spirit thereof.

(Outline of the Invention)

In a wafer process for forming a reverse blocking IGBT with a breakdown voltage of 600 V according to the invention, a p-type isolation layer needs to be formed at a depth that extends from a front surface to a rear surface of a substrate. When the p-type isolation layer is formed, crystal defects are introduced into a semiconductor substrate due to high-temperature long-term diffusion. In order to reduce the density of the crystal defects, a gettering polysilicon layer is provided on the rear surface side of the substrate prior to the formation of the p-type isolation layer. A necessary MOS gate structure is formed in a portion of the front surface of the substrate which is surrounded by the p-type isolation layer. The crystal defects which are introduced into the semiconductor substrate by the above-mentioned isolation diffusion process are gettered to the gettering polysilicon layer during a p-type isolation layer diffusion process and a MOS gate structure forming process and are reduced. Then, the rear surface of the substrate is ground and the thickness of the semiconductor substrate is reduced to 100 µm. In addition, the entire gettering polysilicon layer is removed. Therefore, the gettering polysilicon layer is not present in the completed reverse blocking IGBT chip. That is, a secondary problem is not caused by the formation of the gettering polysilicon layer.

As such, in a method for manufacturing a reverse blocking MOS semiconductor device according to the invention, the gettering polysilicon layer is formed in order to minimize the adverse effect of a process of forming the p-type isolation layer involving high-temperature long-term diffusion on semiconductor characteristics. Therefore, it is important that the gettering polysilicon layer be formed before the p-type isolation layer forming process. In addition, only the gettering process according to the invention is insufficient to reduce the density of the crystal defects caused by the p-type isolation layer forming process. The reason is that, when the gettering function which is effective in the process subsequent to the p-type isolation layer forming process is not maintained, the semiconductor characteristics are likely to deteriorate in the subsequent process (for example, a MOS gate structure forming process) due to the adverse effect of the remaining crystal defects. The inventors found that it was effective to set the thickness of the gettering polysilicon layer to a predetermined value or more in order to maintain the gettering function to be effective in the process subsequent to the p-type isolation layer forming process. The invention has been made on the basis of the findings.

As described above, the invention has been directly made on the basis of the findings that the gettering function of the gettering polysilicon layer is not necessarily sufficient in the related art. The relation between yield and the thickness of the gettering polysilicon layer was verified in order to confirm the validity of the gettering function. FIG. 1 illustrates the relation between yield and the thickness of the gettering polysilicon layer which is formed in the initial stage of the wafer process for a reverse blocking IGBT with a breakdown voltage of 600 V. FIG. 1 is a characteristic diagram illustrating the relation between the original thickness of the formed gettering polysilicon layer and the yield of the reverse blocking IGBT according to the invention. The result illustrated in FIG. 1 proved that the thickness of the gettering polysilicon layer which was reduced by single crystallization depended on the temperature, time, and atmosphere of a heat treatment in the MOS gate structure forming process. Specifically, the thickness of the gettering polysilicon layer reduced by single crystallization is about 1.6 µm in a reverse blocking IGBT with a breakdown voltage of 600 V and is about 1.9 µm in a reverse blocking IGBT with a breakdown voltage of 1200 V (not illustrated) and the gettering function is removed. Therefore, when the thickness of the gettering polysilicon layer is equal to or less than the above-mentioned value, yield is reduced. For example, when the thickness is equal to or more than 2.0 µm, yield is improved. Preferably, the thickness of the gettering polysilicon layer is, for example, about 3 µm. In FIG. 1, the residual limit thickness (1.7 µm) of a polysilicon layer after gate oxidation means the residual limit thickness of the gettering polysilicon layer which is not vanished by single crystallization even in the MOS gate structure forming process which is performed after the p-type isolation layer forming process in the method for manufacturing the reverse blocking IGBT with a breakdown voltage of 600 V.

In the method for manufacturing the reverse blocking IGBT according to the related art, as a gettering layer, a gettering polysilicon layer which was deposited on one surface (rear surface) of a wafer had a small thickness of about 1.5 µm or less before a general wafer process was performed on the wafer. It was found that, at the thickness, the entire gettering polysilicon layer was single-crystallized in a heat treatment process up to a gate oxide film process and was likely to function as the gettering layer. In addition, a method which forms a damage layer using a sandblast method, instead of the gettering polysilicon layer, has been known. In the method, similarly, it was found that the damage layer was removed in the heat treatment process up to the gate oxide film process and the gettering effect was not exhibited. In a process subsequent to the gate oxide film forming process in the process for forming the MOS gate structure, a heat treatment is performed at a temperature of about 1000° C. Therefore, it is preferable that the gettering polysilicon layer remain, without being single-crystallized, until a front surface structure including the MOS gate structure is formed, and have a sufficient gettering function. After the front surface structure including the MOS gate structure is formed, a process for grinding the rear surface of the n-type semiconductor substrate to reduce the thickness of the -type semiconductor substrate is performed. Therefore, the gettering layer, such as the gettering polysilicon layer, is removed together with heavy metal impurities or crystal defects introduced thereinto. As a result, the heavy metal impurities or the crystal defects do not remain in the completed reverse blocking IGBT and do not have a secondary adverse effect on the reverse blocking IGBT.

In general, the gettering polysilicon layer is formed by a CVD method. When a thick gettering polysilicon layer is formed once by the CVD method, the wafer adheres to a boat while the polysilicon layer is being formed. When the wafer is detached from the boat, a defect, such as the chipping-off of the outer circumference of the wafer, is likely to occur. The thickness of the polysilicon layer which can be formed once by the present CVD apparatus, without the wafer adhering to the boat, is about 1.5 µm. In order to form the polysilicon layer with a thickness equal to or greater than the above-mentioned value, a process for forming a polysilicon layer with a thickness of about 1.5 µm, carrying the wafer out of the CVD device, detaching the wafer from the boat, setting the wafer to the boat, and forming the polysilicon layer needs to be performed a plurality of times, if necessary.

Embodiment

Figure 10:
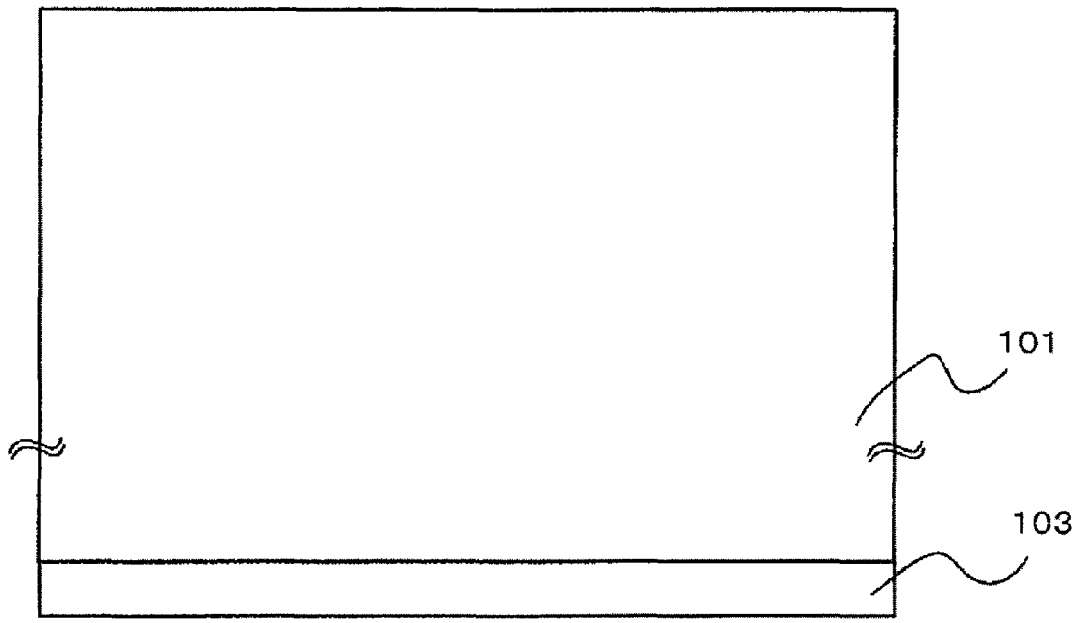
FIG. 10 is a cross-sectional view illustrating the element of the reverse blocking IGBT according to the invention which is being manufactured (part 2)

A method for manufacturing a reverse blocking IGBT will be described in detail as an example of the method for manufacturing the reverse blocking MOS semiconductor device according to the invention with reference to FIGS. 9 to 19. FIGS. 9 to 19 are cross-sectional views illustrating an element of the reverse blocking IGBT according to the invention which is being manufactured. The following semiconductor device is an example of a reverse blocking IGBT with a breakdown voltage of 1200 V. The following cross-sectional views illustrate a portion of a silicon substrate (silicon wafer) corresponding to an element of the reverse blocking IGBT. First, for example, an FZ n-type silicon substrate (hereinafter, referred to as an FZ silicon substrate) 101 which is manufactured by a floating zone (FZ) method and has a thickness of 525 μm and an impurity concentration of $7.5 \times 10^{13}$ cm$^{-3}$ is prepared. Then, a polysilicon layer (gettering polysilicon layer) 103 with a thickness of, for example, 3.0 μm is formed on a rear surface 102a of the FZ silicon substrate 101 (FIG. 9) by a CVD method and serves as a polysilicon back seal (FIG. 10).

The polysilicon back seal is formed in order to use the gettering function of the polysilicon layer 103. Specifically, in the case of a reverse blocking IGBT, crystal defects which are caused by a large amount of doped oxygen and occur in the semiconductor substrate (FZ silicon substrate 101) due to the formation of a thick initial oxide film serving as an isolation layer diffusion mask, which will be described below, and high-temperature long-term diffusion associated with the formation of the p-type isolation layer are gettered to the polysilicon layer 103 by the gettering function and the density of the crystal defects is reduced. At that time, when the polysilicon layer 103 has a small thickness of about 1.5 μm as in the related art, the gettering polysilicon layer is single-crystallized by, for example, high-temperature long-term diffusion associated with the formation of the p-type isolation layer and the temperature, time, and atmosphere of a heat treatment in a process for forming a semiconductor functional region and the gettering function is almost removed. In the invention, the thickness of the polysilicon layer 103 is preferably equal to or greater than, for example, 2 μm and more preferably is, for example, 3.0 μm in order to prevent this phenomenon.

Figure 11:
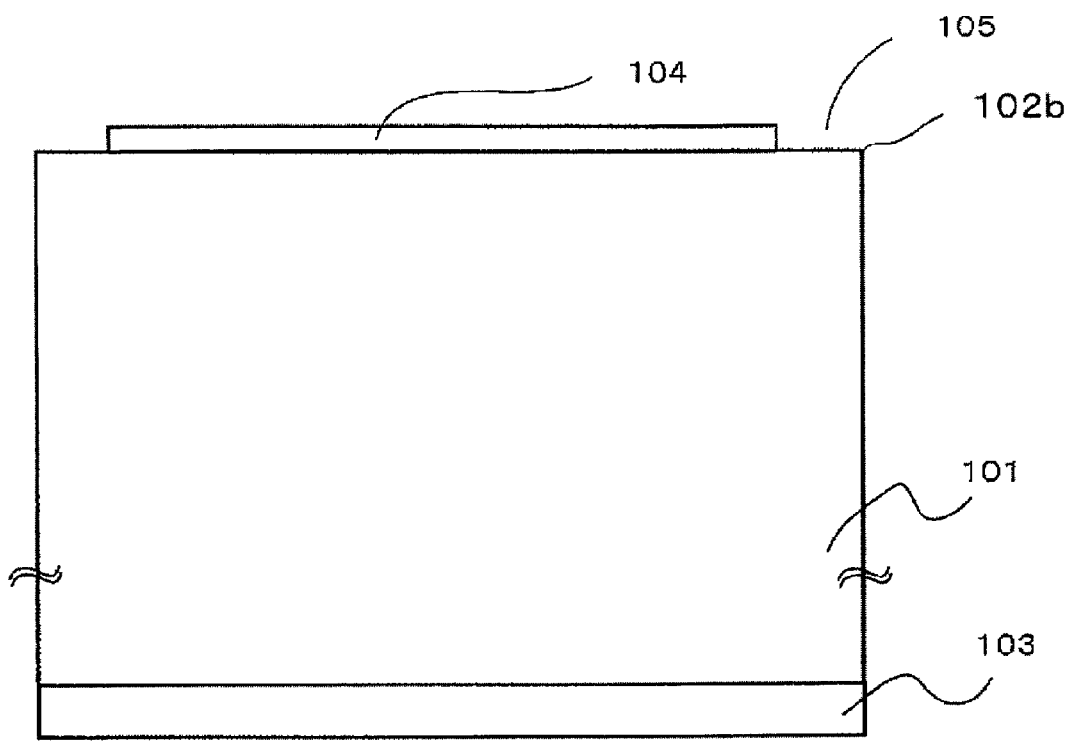
FIG. 11 is a cross-sectional view illustrating the element of the reverse blocking IGBT according to the invention which is being manufactured (part 3)
Figure 12:
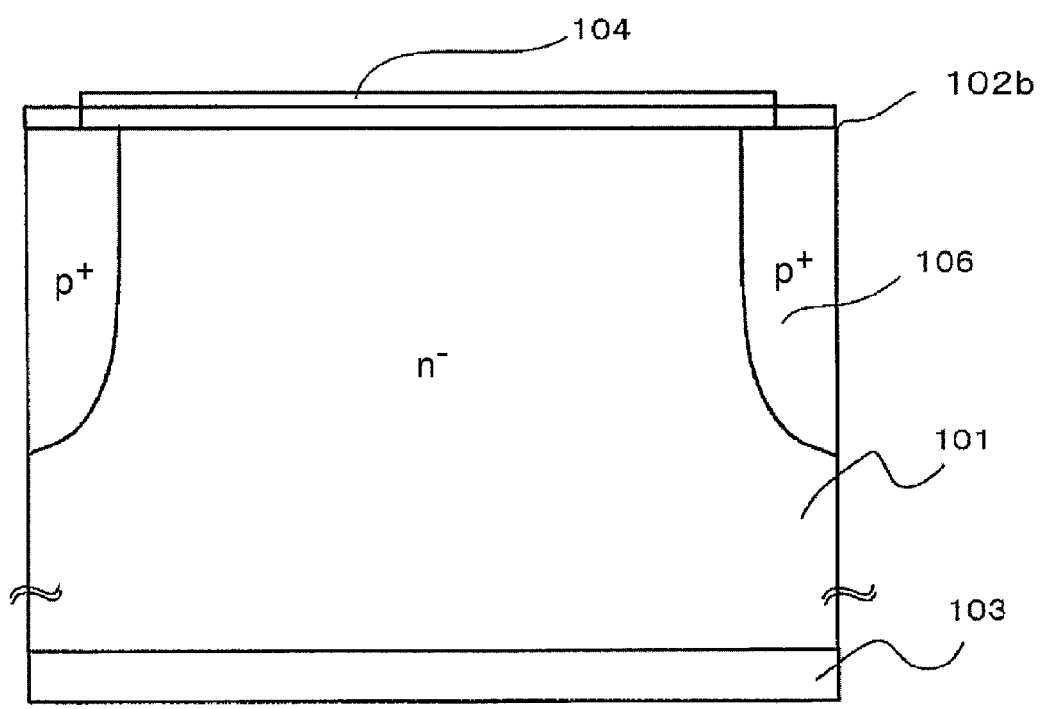
FIG. 12 is a cross-sectional view illustrating the element of the reverse blocking IGBT according to the invention which is being manufactured (part 4)
Figure 13:
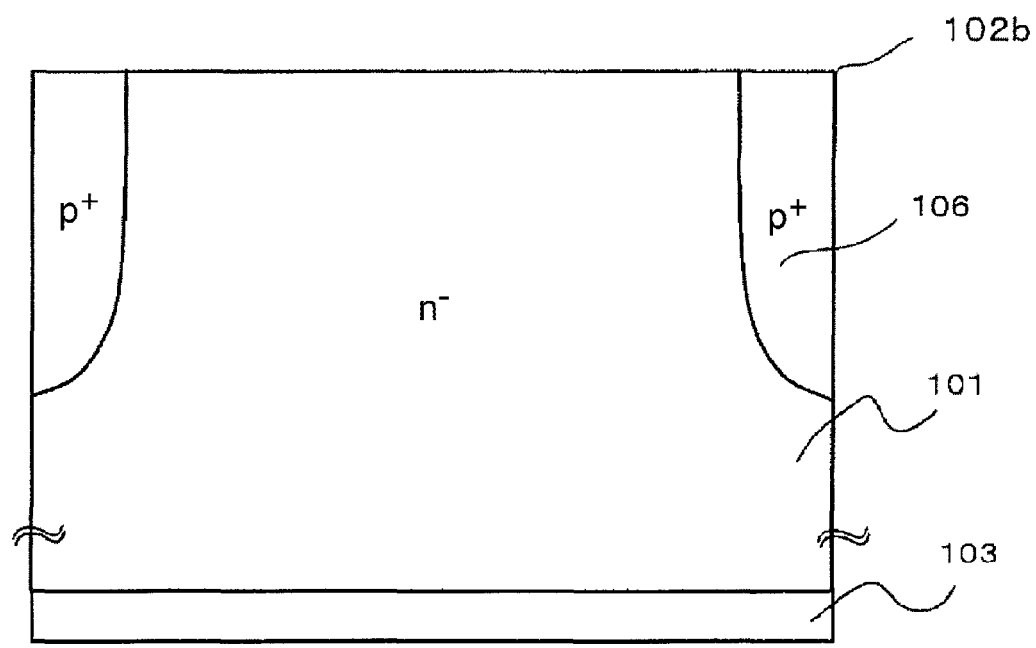
FIG. 13 is a cross-sectional view illustrating the element of the reverse blocking IGBT according to the invention which is being manufactured (part 5)

Then, an initial oxide film 104 with a thickness of 2.4 μm (a thickness of 1.6 μm when the breakdown voltage is 600 V) is formed on a front surface 102b of the FZ silicon substrate 101 and an opening portion 105 with a width of, for example, 100 μm is formed in an outer circumferential portion of the initial oxide film 104, which surrounds a portion in which a p base region will be formed in the subsequent process, by photo etching (FIG. 11). Then, boron (B) ions are implanted from the opening portion 105 through a screen oxide film. Then, a heat treatment is performed to diffuse the boron ions implanted into a portion of the FZ silicon substrate 101 which is exposed through the opening portion 105, thereby forming a boron deposition region (not illustrated). The heat treatment is performed in an oxygen atmosphere at a temperature of about 1200° C. or higher, for example, about 1300° C. to diffuse the boron ions to a depth of 200 μm (100 μm when the breakdown voltage is 600 V), thereby forming, for example, a p$^+$ isolation layer 106 in a portion (dicing line) to be diced (FIG. 12). For example, a diffusion time of about 300 hours is required to form the p$^+$ isolation layer 106 at a depth of 200 μm at a temperature of about 1300° C.

Then, the entire initial oxide film 104 is removed (FIG. 13) and a MOS gate structure or a front surface structure of an edge termination structure portion (not illustrated) is formed in a portion of the front surface of the substrate which is surrounded by the p-type isolation layer. The MOS gate structure is formed in an active portion in which a current flows in an on state. The active portion is surrounded by the edge termination structure portion. The edge termination structure portion includes, for example, a junction termination surface protection mechanism using a field oxide film or an electric field reduction mechanism including a field limiting ring and a field plate. The edge termination structure portion is surrounded by the p-type isolation layer. The edge termination structure portion may be formed at the same time as each layer of the MOS gate structure including, for example, an interlayer insulating film, a p base layer, and a gate electrode is formed, or it may be formed using the MOS gate structure forming process. Hereinafter, the description of the process for forming the edge termination structure portion will not be repeated.

Figure 14:
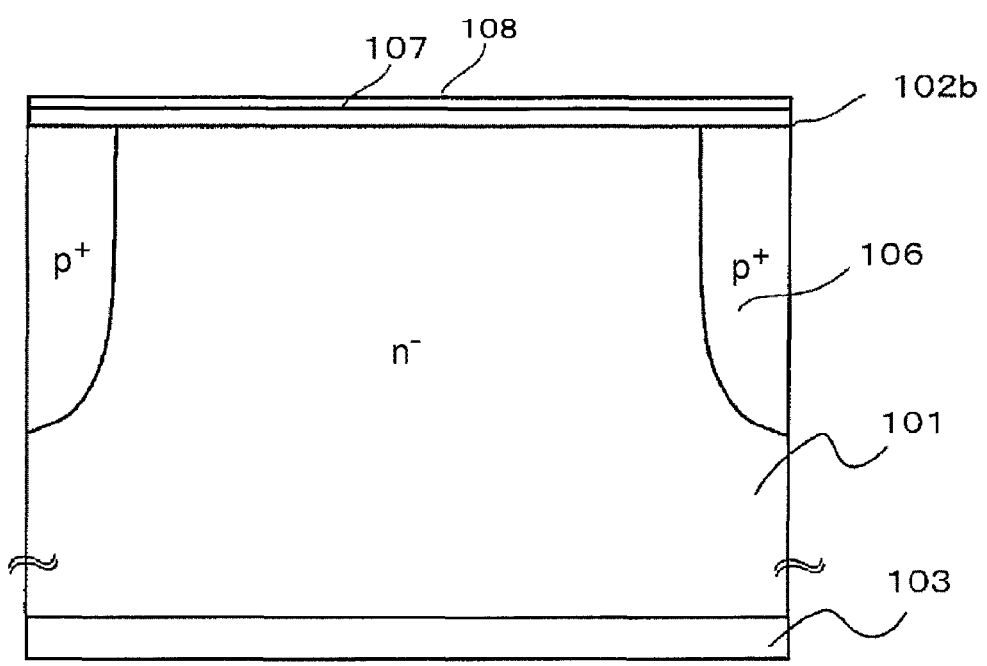
FIG. 14 is a cross-sectional view illustrating the element of the reverse blocking IGBT according to the invention which is being manufactured (part 6)
Figure 15:
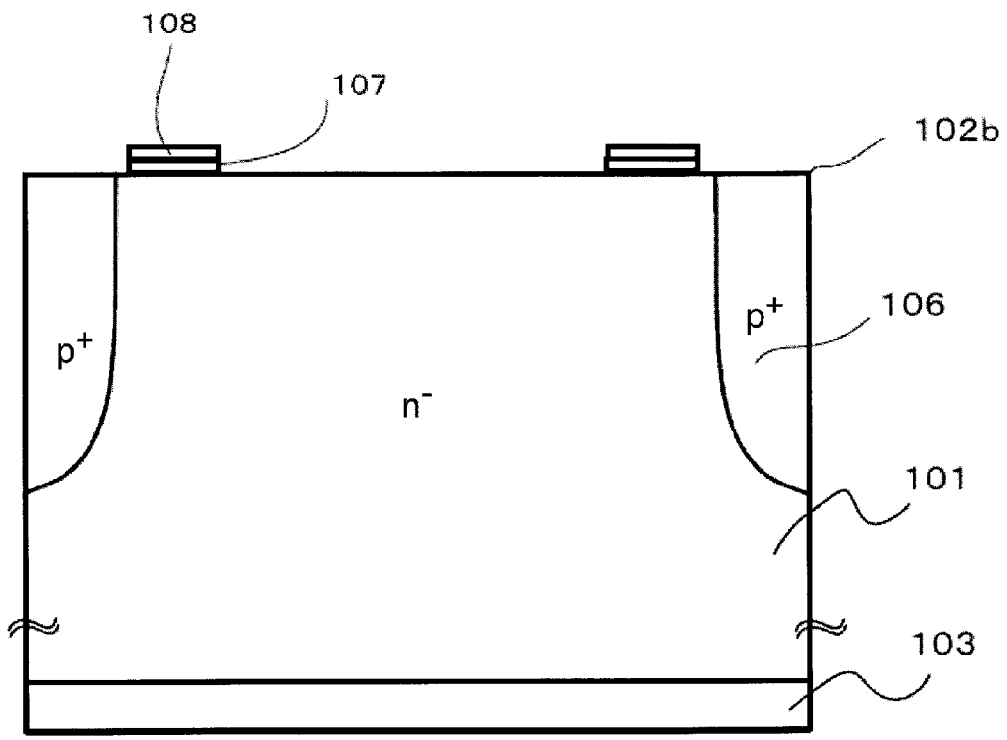
FIG. 15 is a cross-sectional view illustrating the element of the reverse blocking IGBT according to the invention which is being manufactured (part 7)

Specifically, a polysilicon film 108 is formed on the front surface 102b of the FZ silicon substrate 101, with a gate oxide film 107 interposed therebetween (FIG. 14). Then, necessary portions of the gate oxide film 107 and the polysilicon film 108 on the front surface 102b of the FZ silicon substrate 101 are patterned (FIG. 15). Then, p-type impurities are implanted by, for example, a self-alignment method using the polysilicon film 108 as a mask and are thermally diffused at a high temperature of about 1150° C. for about 120 minutes to form a p base layer 110 in a surface layer of the front surface 102b of the FZ silicon substrate 101. When the thermal diffusion process is performed at a high temperature of 1000° C. or higher, it is possible to introduce oxygen-induced defects from an operation region of the IGBT into the polysilicon layer 103 which is a gettering source (extrinsic gettering). Therefore, it is possible to reduce the density of the crystal defects in the operation region.

Figure 16:
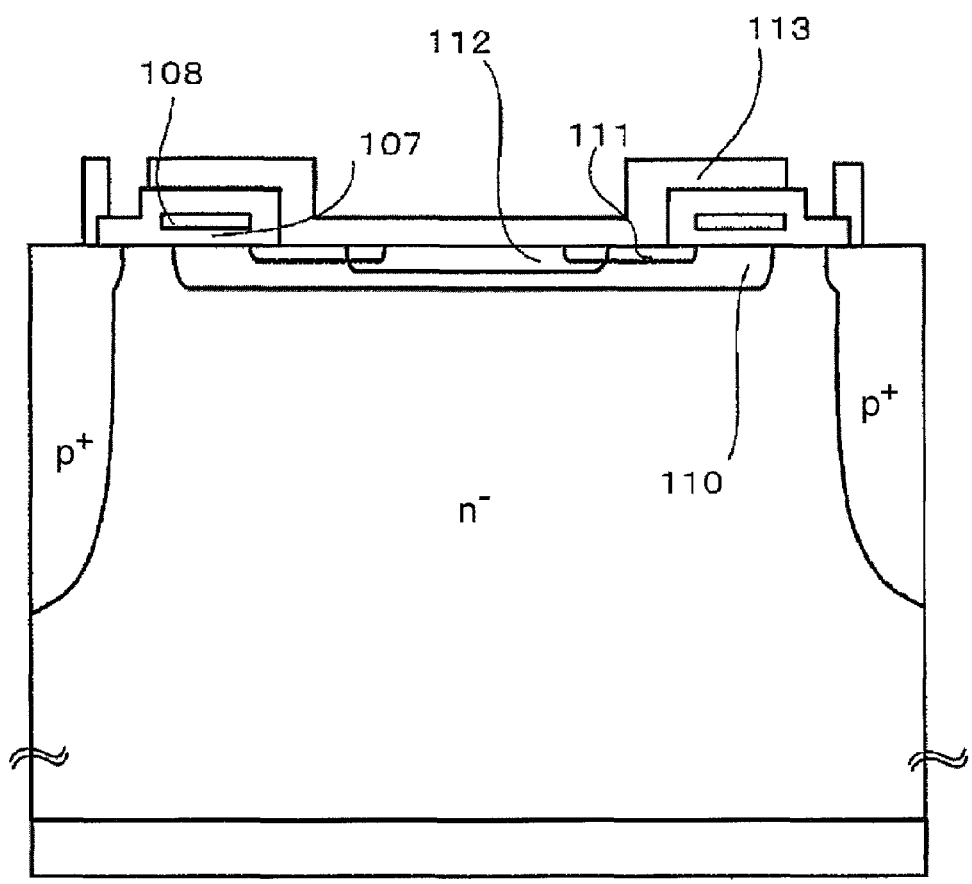
FIG. 16 is a cross-sectional view illustrating the element of the reverse blocking IGBT according to the invention which is being manufactured (part 8)

Then, arsenic ions and boron ions are implanted to selectively form an n$^+$ emitter layer 111 and a p$^+$ collector layer 112 in the p base layer 110, respectively. Then, an annealing process is performed, for example, at a temperature of about 1000° C. for about 30 minutes to activate the arsenic ions and the boron ions. Then, an interlayer insulating film is formed so as to cover the gate oxide film 107 and the polysilicon film 108. Then, the interlayer insulating film on the n$^+$ emitter layer 111 and the p$^+$ collector layer 112 is removed to form an opening portion and an emitter metal electrode 113 is formed so as to come into contact with the n$^+$ emitter layer 111 and the p$^+$ collector layer 112. A protective film (not illustrated), such as a polyimide film, is bonded, if necessary (FIG. 16). In addition, electron beam irradiation or helium irradiation is performed in order to increase the processing speed.

Figure 17:
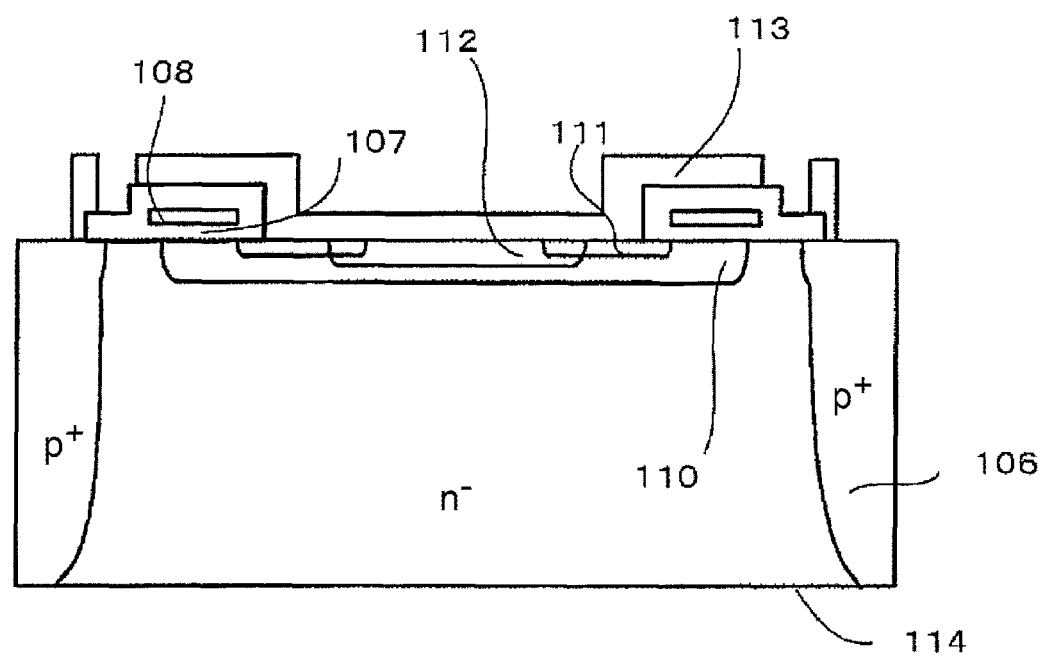
FIG. 17 is a cross-sectional view illustrating the element of the reverse blocking IGBT according to the invention which is being manufactured (part 9)

Then, the rear surface 102a of the FZ silicon substrate 101 is mechanically ground and the thickness of the FZ silicon substrate 101 is reduced to, for example, about 200 μm (when the breakdown voltage is 600 V, the thickness of the FZ silicon substrate 101 is reduced to, for example, about 100 μm). Then, mechanical polishing or chemical etching is performed on the rear surface 102a of the FZ silicon substrate 101 in order to remove stress or distortion which occurs when the rear surface 102a of the FZ silicon substrate 101 is ground. In the case of the chemical etching, the rear surface 102a of the FZ silicon substrate 101 is in a good state at a chemical etching rate of 0.25 μm/s to 0.45 μm/s. Therefore, the mechanical polishing or chemical etching is very effective in improving the reverse voltage blocking capability characteristics of the reverse blocking IGBT. Finally, the thickness of the FZ silicon substrate 101 is set to about 180 µm and the p⁺ isolation layer 106 is exposed from the ground surface 114 (FIG. 17).

Figure 18:
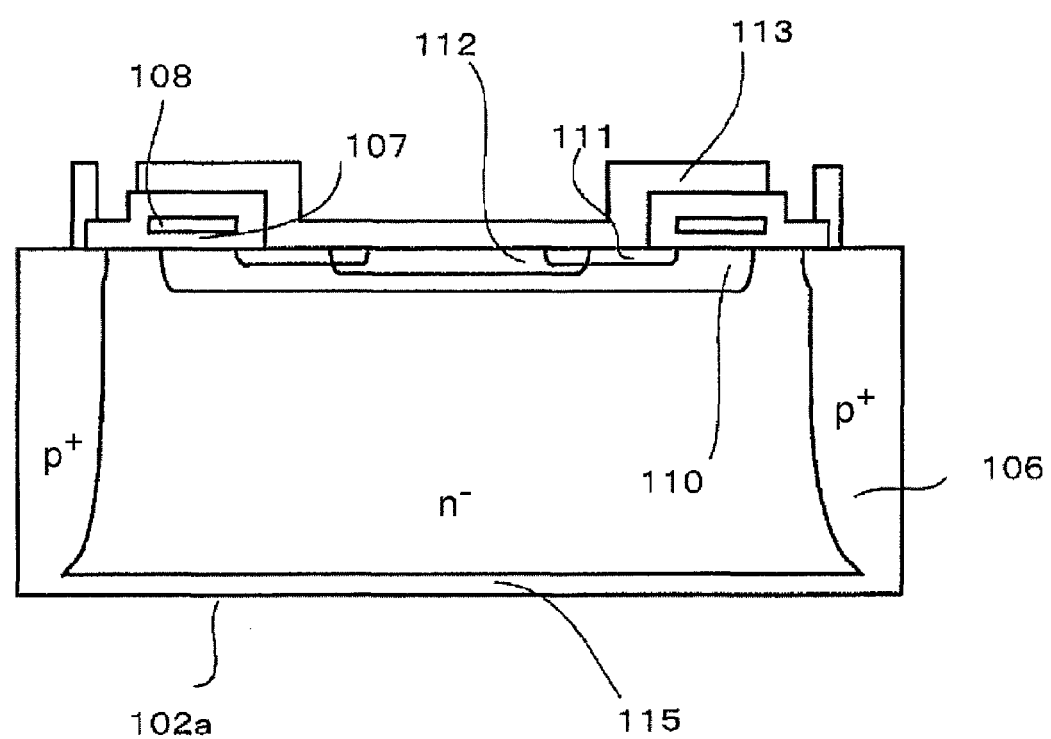
FIG. 18 is a cross-sectional view illustrating the element of the reverse blocking IGBT according to the invention which is being manufactured (part 10)
Figure 19:
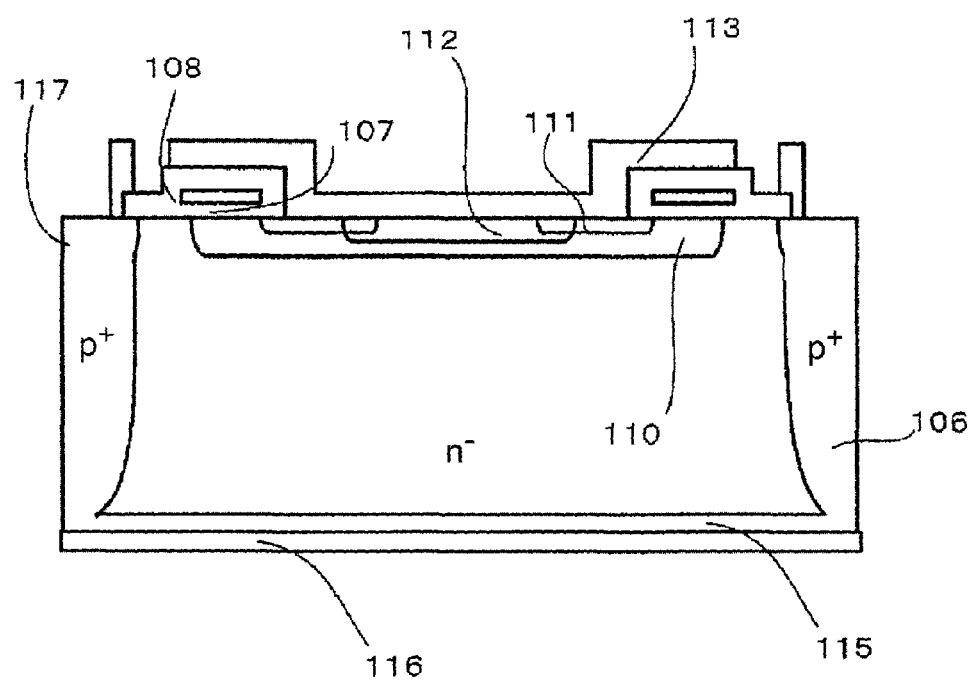
FIG. 19 is a cross-sectional view illustrating the element of the reverse blocking IGBT according to the invention which is being manufactured (part 11).

Then, boron ions are implanted into the ground rear surface 102a of the FZ silicon substrate 101 with a dose of, for example, $5 \times 10^{13}$ cm⁻² and annealing is performed at a low temperature of 400° C. for about 1 hour to form a p-type collector layer 115 with an activated boron peak concentration of, for example, about $1 \times 10^{17}$ cm⁻³ and a thickness of, for example, 1 µm or less (FIG. 18). Then, a collector electrode 116 is formed so as to come into ohmic contact with the rear surface 102a (p-type collector layer 115) of the FZ silicon substrate 101. Finally, the FZ silicon substrate 101 is cut along a center line (dicing line) 117 of the p⁺ isolation layer 106. In this way, the reverse blocking IGBT illustrated in FIG. 19 is completed.

When the peak concentration of the p-type collector layer 115 is less than $5 \times 10^{16}$ cm⁻³, implantation efficiency is reduced and the on-voltage increases. In addition, when the reverse voltage is applied, the p-type collector layer 115 is completely depleted and the reverse breakdown voltage is reduced. On the other hand, when the peak concentration of the p-type collector layer 115 is more than $1 \times 10^{18}$ cm³, the number of minority carriers injected into the drift region increases and a reverse recovery current also increases. Therefore, it is preferable that the peak concentration of the p-type collector layer 115 be, for example, equal to or more than $5 \times 10^{16}$ cm⁻³ and equal to or less than $1 \times 10^{18}$ cm⁻³.

As described above, according to the embodiment, in the reverse blocking IGBT with a breakdown voltage of 600 V, the gettering polysilicon layer with a thickness of about 1.6 µm is vanished by single crystallization. In the reverse blocking IGBT with a breakdown voltage of 1200 V, the gettering polysilicon layer with a thickness of about 1.9 µm is single-crystallized. Therefore, in the invention, when a reverse blocking IGBT with a breakdown voltage of about 600 V to 1200 V is manufactured, the gettering polysilicon layer with a thickness that is equal to or greater than 2 µm, preferably, with a thickness of about 3 µm is formed on the rear surface 102a of the FZ silicon substrate 101 before the p⁺ isolation layer diffusion process and the MOS gate structure forming process. As such, when the gettering polysilicon layer with a sufficiently large thickness is provided, the gettering polysilicon layer can remain up to the gate oxide film process, without disappearing, even after the high-temperature long-term isolation layer forming process or even in the heat treatment for forming the field limiting ring. In the heat treatment process before the gate oxide film process, since heavy metal impurities or crystal defects are gettered to the gettering polysilicon layer, it is possible to form a high-quality gate oxide film and to manufacture a reverse blocking IGBT with high yield and stable reliability.

As described above, according to the invention, it is possible to reduce a high-temperature reverse leakage current when the reverse voltage is applied in the reverse blocking IGBT. In addition, it is possible to form a high-quality gate oxide film with a small number of crystal defects. Therefore, it is possible to obtain a gate oxide film with high reliability.

The invention is not limited to the above-described embodiment, but various modifications and changes of the invention can be made without departing from the scope and spirit of the invention. For example, in the above-described embodiment, the method for manufacturing the reverse blocking IGBT has been described. The invention can be applied to other semiconductor devices without a p-type isolation layer, such as the IGBTs according to the related art. In this case, no problem occurs. In addition, in the above-described embodiment, the first conductivity type is an n type and the second conductivity type is a p type. However, in the invention, the first conductivity type may be a p type and the second conductivity type may be an n type. In this case, the same effect as described above is obtained.

INDUSTRIAL APPLICABILITY

As described above, the method for manufacturing the semiconductor device according to the invention is useful for power conversion devices, such as converters or inverters, or power supply devices, such as various industrial machines, particularly, a reverse blocking MOS semiconductor device with bidirectional breakdown voltage characteristics.

EXPLANATIONS OF LETTERS OR NUMERALS

101 FZ SILICON SUBSTRATE
102a REAR SURFACE OF FZ SILICON SUBSTRATE
102b FRONT SURFACE OF FZ SILICON SUBSTRATE
103 POLYSILICON LAYER
104 INITIAL OXIDE FILM
105 OPENING PORTION
106 p⁺ ISOLATION LAYER
107 GATE OXIDE FILM
108 POLYSILICON FILM (GATE ELECTRODE)
110 p BASE LAYER
111 n⁺ EMITTER LAYER
112 p⁺ COLLECTOR LAYER
113 EMITTER METAL ELECTRODE
114 GROUND SURFACE
115 p-TYPE COLLECTOR LAYER
116 COLLECTOR ELECTRODE
117 CENTER LINE

What is claimed is:

1. A method for manufacturing a reverse blocking semiconductor device that includes a second-conductivity-type isolation layer which is formed in a first-conductivity-type semiconductor substrate having a first main surface and a second main surface that are opposite to each other at a depth extending from the first main surface to the second main surface and has a forward voltage blocking capability and a reverse voltage blocking capability, comprising:

a first step of forming a gettering polysilicon layer on the second main surface of the first-conductivity-type semiconductor substrate;

a second step of forming the second-conductivity-type isolation layer in an outer circumferential portion which surrounds an active portion provided in a central portion of the first main surface at a depth extending from the first main surface to the second main surface; and a third step of forming a front surface semiconductor region including an insulated gate structure on the first main surface of the first-conductivity-type semiconductor substrate in the active portion;

a fourth step of grinding the second main surface of the first-conductivity-type semiconductor substrate to reduce the thickness of the first-conductivity-type semiconductor substrate to a value which is determined by a predetermined breakdown voltage; and a fifth step of removing the gettering polysilicon layer from the second main surface of the first-conductivity-type semiconductor substrate;

wherein the first step forms the gettering polysilicon layer with such a thickness that the gettering polysilicon layer remains, without being vanished by single crystallization, until the third step ends.

2. The method for manufacturing a semiconductor device according to claim 1,
wherein a thickness of the gettering polysilicon layer is equal to or greater than 2 μm.

3. The method for manufacturing a semiconductor device according to claim 2,
wherein the first step includes:
a mounting step of mounting the first-conductivity-type semiconductor substrate on a boat of a chemical vapor deposition apparatus;
a film deposition step of forming the gettering polysilicon layer with a thickness of 1.5 μm or less on the second main surface of the first-conductivity-type semiconductor substrate using a chemical vapor deposition method after the mounting step; and
a detachment step of detaching the first-conductivity-type semiconductor substrate from the boat after the film deposition step, and
a set of the mounting step, the film deposition step, and the detachment step is repeatedly performed to laminate the gettering polysilicon layer such that the gettering polysilicon layer has a necessary thickness.

4. The method for manufacturing a semiconductor device according to claim 1,
wherein, in the third step, both the front surface semiconductor region in the active portion and a front surface semiconductor region which forms a edge termination structure portion between the active portion and the second-conductivity-type isolation layer are formed on the first main surface of the first-conductivity-type semiconductor substrate.

5. The method for manufacturing a semiconductor device according to claim 2,
wherein, in the third step, both the front surface semiconductor region in the active portion and a front surface semiconductor region which forms a edge termination structure portion between the active portion and the second-conductivity-type isolation layer are formed on the first main surface of the first-conductivity-type semiconductor substrate.

6. The method for manufacturing a semiconductor device according to claim 3,
wherein, in the third step, both the front surface semiconductor region in the active portion and a front surface semiconductor region which forms a edge termination structure portion between the active portion and the second-conductivity-type isolation layer are formed on the first main surface of the first-conductivity-type semiconductor substrate.

7. A method for manufacturing a reverse blocking semiconductor device, comprising:
forming a gettering polysilicon layer on a surface of a semiconductor substrate;
forming a gate structure on an opposite surface of the semiconductor substrate; and
removing the gettering polysilicon layer;
wherein the gettering polysilicon layer is formed with a thickness that enables at least a portion of the gettering polysilicon layer to remain until at least a portion of the gate structure is formed, after a manufacturing process subsequent to forming the gettering polysilicon layer exposes the gettering polysilicon layer to a crystallization phenomenon.

8. The method of claim 7, wherein the gettering polysilicon layer is formed before forming of an isolation layer in the opposite surface of the semiconductor substrate.

9. The method of claim 7, wherein forming the gettering polysilicon layer includes depositing the gettering polysilicon layer by chemical vapor deposition.

10. The method of claim 7, wherein the gettering polysilicon layer is formed with a thickness of at least 2 μm.

11. The method of claim 7, wherein the gettering polysilicon layer is formed with a thickness of substantially 3 μm.

* * * * *